United States Patent
Bol et al.

(10) Patent No.: US 9,431,487 B2
(45) Date of Patent: Aug. 30, 2016

(54) GRAPHENE LAYER TRANSFER

(71) Applicant: International Business Machines Corporation, Armonk, NY (US)

(72) Inventors: Ageeth A. Bol, Yorktown Heights, NY (US); Steven E. Steen, Peekskill, NY (US); James Vichiconti, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 13/739,511

(22) Filed: Jan. 11, 2013

(65) Prior Publication Data
US 2016/0049475 A1    Feb. 18, 2016

(51) Int. Cl.
*H01L 29/16* (2006.01)
*H01L 29/786* (2006.01)
*H01L 29/66* (2006.01)
*H01L 29/778* (2006.01)

(52) U.S. Cl.
CPC ..... *H01L 29/1606* (2013.01); *H01L 29/66045* (2013.01); *H01L 29/778* (2013.01); *H01L 29/78684* (2013.01)

(58) Field of Classification Search
CPC ....................................... H01L 29/786
USPC ............................... 257/29, 76–77
See application file for complete search history.

(56) References Cited

U.S. PATENT DOCUMENTS

| 8,043,687 | B2 | 10/2011 | Kamins et al. |
| 2003/0160283 | A1* | 8/2003 | Tanaka ............... H01L 27/12 257/347 |
| 2005/0170606 | A1* | 8/2005 | Fu ............. A61F 2/958 438/424 |
| 2010/0143726 | A1 | 6/2010 | Goelzhaeuser et al. |
| 2011/0030879 | A1 | 2/2011 | Veerasamy |
| 2011/0048625 | A1 | 3/2011 | Caldwell et al. |
| 2011/0108521 | A1 | 5/2011 | Woo et al. |
| 2011/0308717 | A1 | 12/2011 | Cho et al. |
| 2011/0315657 | A1 | 12/2011 | Cho et al. |

(Continued)

FOREIGN PATENT DOCUMENTS

| EP | 2402999 A1 | 1/2012 |
| JP | 2011105590 | 6/2011 |

(Continued)

OTHER PUBLICATIONS

Mattevi, C., et al., "A review of chemical vapour deposition of graphene on copper", J. Mater. Chem., First published on the web Nov. 10, 2010, 21, pp. 3324-3334.

*Primary Examiner* — Tran Tran
(74) *Attorney, Agent, or Firm* — Scully, Scott, Murphy & Presser, P.C.; Louis J. Percello, Esq.

(57) ABSTRACT

A method to transfer a layer of graphene from one substrate to another substrate is provided. The method includes providing a first layered structure including, from bottom to top, a copper foil, a layer of graphene, an adhesive layer and a carrier substrate. The copper foil is removed exposing a surface of the layer of graphene. Next, an oxide bonding enhancement dielectric layer is formed on the exposed surface of the layer of graphene. A second layered structure including a receiver substrate and a dielectric oxide layer is provided. Next, an exposed surface of the dielectric oxide layer is bonded to an exposed surface of the oxide bonding enhancement dielectric layer. The carrier substrate and the adhesive layer are removed exposing the layer of graphene.

15 Claims, 3 Drawing Sheets

(56) References Cited

U.S. PATENT DOCUMENTS

| | | | |
|---|---|---|---|
| 2013/0105795 A1* | 5/2013 | Kim et al. | 257/49 |
| 2013/0160283 A1* | 6/2013 | Wu | 29/623.1 |
| 2013/0161587 A1* | 6/2013 | Xianyu et al. | 257/29 |
| 2013/0193412 A1* | 8/2013 | Lee | H01L 21/6835 257/29 |

FOREIGN PATENT DOCUMENTS

| | | |
|---|---|---|
| WO | WO2011016836 A2 | 2/2011 |
| WO | WO2011046655 A2 | 4/2011 |
| WO | WO2012002666 A2 | 1/2012 |
| WO | WO2012008789 A2 | 1/2012 |

* cited by examiner

GRAPHENE LAYER TRANSFER

This invention was made with Government Support under Contract No.: FA8650-08-C-7838 awarded by Defense Advanced Research Projects Agency (DARPA). The Government thus may have certain rights to this invention.

BACKGROUND

The present application relates to a method of transferring a layer of graphene from one substrate to another substrate to allow further processing or finishing. The present disclosure also relates to a semiconductor structure and device including the transferred layer of graphene.

Several trends presently exist in the semiconductor and electronics industry including, for example, devices are being fabricated that are smaller, faster and require less power than the previous generations of devices. One reason for these trends is that personal devices such as, for example, cellular phones and personal computing devices, are being fabricated that are smaller and more portable. In addition to being smaller and more portable, personal devices also require increased memory, more computational power and speed. In view of these ongoing trends, there is an increased demand in the industry for smaller and faster transistors used to provide the core functionality of the integrated circuits used in these devices.

Accordingly, in the semiconductor industry there is a continuing trend toward fabricating integrated circuits (ICs) with higher densities. To achieve higher densities, there has been, and continues to be, efforts toward down scaling the dimensions of the devices on semiconductor wafers generally produced from bulk silicon. These trends are pushing the current technology to its limits. In order to accomplish these trends, high densities, smaller feature sizes, smaller separations between features, and more precise feature shapes are required in integrated circuits (ICs).

Significant resources go into down scaling the dimensions of devices and increasing packing densities. For example, significant time may be required to design such down scaled transistors. Moreover, the equipment necessary to produce such devices may be expensive and/or processes related to producing such devices may have to be tightly controlled and/or be operated under specific conditions. Accordingly, there are significant costs associated with exercising quality control over semiconductor fabrication.

In view of the above, the semiconductor industry is pursuing graphene to achieve some of the aforementioned goals. Graphene, which is essentially a flat sheet of carbon atoms, is a promising material for radio frequency (RF) transistors and other electronic transistors. Typical RF transistors are made from silicon or more expensive semiconductors such as, for example, indium phosphide (InP). The measured mobility of electrons in graphene was found to be as high as 200,000 $cm^2V^{-1}s^{-1}$, while it is only about 5400 $cm^2V^{-1}s^{-1}$ for InP and about 1400 $cm^2V^{-1}s^{-1}$ for silicon.

High quality graphene is typically formed on a copper foil that does not allow for easy processing using existing semiconductor device processes. As such, there is a need for a method that permits the transfer of a layer of graphene formed on a copper foil to a substrate, such as a semiconductor substrate, which can then be further processed using existing semiconductor device processing techniques.

SUMMARY

A method to transfer a layer of graphene from one substrate to another substrate which can allow for further processing or finishing is provided. The method of the present disclosure includes forming an oxide bonding enhancement dielectric layer on an exposed surface of a layer of graphene that is disposed on a copper foil. A structure including a receiver substrate and a dielectric oxide layer is then bonded to an exposed surface of the oxide bonding enhancement dielectric layer such that an oxide to oxide bond forms between the oxide bonding enhancement dielectric layer and the dielectric oxide layer. Various material layers located on the side of the structure not including the layer of graphene/oxide bonding enhancement dielectric layer are then removed exposing a surface of the layer of graphene. The oxide bonding enhancement dielectric layer ensures that a planarization surface is provided for bonding the layer of graphene to the structure including the receiver substrate.

In one aspect of the present disclosure, a method to transfer a layer of graphene from one substrate to another substrate is provided. The method includes providing a first layered structure including, from bottom to top, a copper foil, a layer of graphene, an adhesive layer and a carrier substrate. The copper foil is removed exposing a surface of the layer of graphene. Next, an oxide bonding enhancement dielectric layer is formed on the exposed surface of the layer of graphene. A second layered structure including a receiver substrate and a dielectric oxide layer is provided. Next, an exposed surface of the dielectric oxide layer is bonded to an exposed surface of the oxide bonding enhancement dielectric layer. The carrier substrate and the adhesive layer are removed exposing the layer of graphene.

In another aspect of the present disclosure, a structure is provided that comprises, from bottom to top, a receiver substrate, an oxide bonding enhancement dielectric layer, and a layer of graphene, wherein a bottommost surface of the layer of graphene directly contacts an uppermost surface of the oxide bonding enhancement dielectric layer. In some embodiments, a dielectric oxide layer can be located between the receiver substrate and the oxide bonding enhancement dielectric layer. In such an embodiment, the dielectric oxide layer is comprised of a different dielectric material than the oxide bonding enhancement dielectric layer.

In yet another aspect of the present disclosure, a structure is provided that includes a receiver substrate, an oxide bonding enhancement dielectric layer located atop the receiver substrate, and a graphene-containing device located atop the oxide bonding enhancement dielectric layer, wherein the graphene-containing device includes at least a layer of graphene having a bottommost surface in direct contact with an uppermost surface of the oxide bonding enhancement dielectric layer.

DETAILED DESCRIPTION

Figure 1:
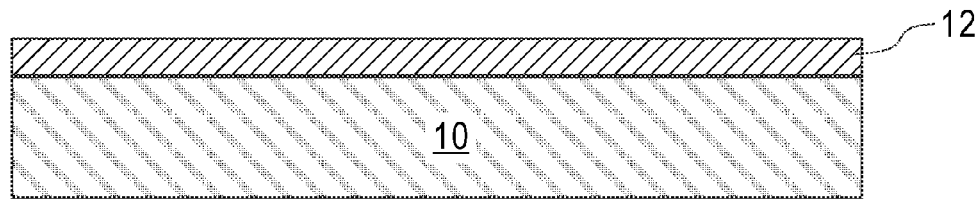
FIG. 1 is a vertical cross sectional view of an initial structure including a layer of graphene located on an exposed surface of a copper foil that can be employed in one embodiment of the present disclosure.

The present disclosure, which discloses a method of transferring a layer of graphene from one substrate to another substrate, and a semiconductor structure and device including the transferred layer of graphene, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals.

For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

As stated above, the present disclosure provides a method to transfer a layer of graphene from one substrate to another substrate which can allow for further processing or finishing. In one example, the method of the present disclosure can be used to transfer a layer of graphene formed on a copper foil to a semiconductor material. The method includes providing a first layered structure including, from bottom to top, a copper foil, a layer of graphene, an adhesive layer and a carrier substrate. The copper foil is removed exposing a surface of the layer of graphene. Next, an oxide bonding enhancement dielectric layer is formed on the exposed surface of the layer of graphene. A second layered structure including a receiver substrate and a dielectric oxide layer is provided. Next, an exposed surface of the dielectric oxide layer is bonded to an exposed surface of the oxide bonding enhancement dielectric layer. The carrier substrate and the adhesive layer are removed exposing the layer of graphene.

Referring first to FIG. 1, there is illustrated an initial structure that includes a layer of graphene 12 located on an exposed surface of a copper foil 10 that can be employed in one embodiment of the present disclosure. The copper foil 10 that can be used in the present disclosure can have a thickness from 15 microns to 35 microns, although thicknesses that are greater than or lesser than this range can also be employed. The copper foil 10 that is employed in the present disclosure is planar, substantially wrinkle-free and without holes or irregularities in the surface of the foil that, if present, could affect the transfer of the layer of graphene 12. By "substantially wrinkle-free" it is meant a surface in which the distance between the peaks and valleys is no greater than 5 microns.

The layer of graphene 12 can be comprised of single-layer graphene (nominally 0.34 nm thick), few-layer graphene (2-10 graphene layers), multi-layer graphene (>10 graphene layers), a mixture of single-layer, few-layer, and multi-layer graphene, or any combination of graphene layers mixed with amorphous and/or disordered carbon phases that result by graphene formation at lower temperatures (between 200° C. and 900° C.). In some embodiments of the present disclosure, the layer of graphene 12 comprises a monolayer. By "monolayer" it is meant one molecule thickness film The layer of graphene 12 can also include, if desired, substitutional (where C atoms in graphene are replaced with dopant atoms covalently bonded to next nearest neighbor, nnn, atoms), dopant atoms or molecules that do not form covalent bonds to graphene and lie on top of the graphene layer or between graphene layers in the case few layer or multilayer intercalated graphene.

The layer of graphene 12 can be formed on the surface of the copper foil 10 utilizing a deposition process such as, for example, chemical vapor deposition (CVD), plasma enhanced chemical vapor deposition (PECVD), and ultra-violet (UV) assisted CVD. In one embodiment of the present disclosure, the deposition of layer of graphene 12 on the copper surface can be performed at a temperature from 950° C. to 1050° C. Other deposition temperatures are possible so long as the deposited layer of graphene is not adversely affected at the selected deposition temperature. The deposition process that can be used in the present disclosure for forming the layer of graphene 12 on the copper foil 10 includes utilizing any known carbon sources including, for example, benzene, propane, ethane and other hydrocarbons, and other C-containing gases.

Figure 2:
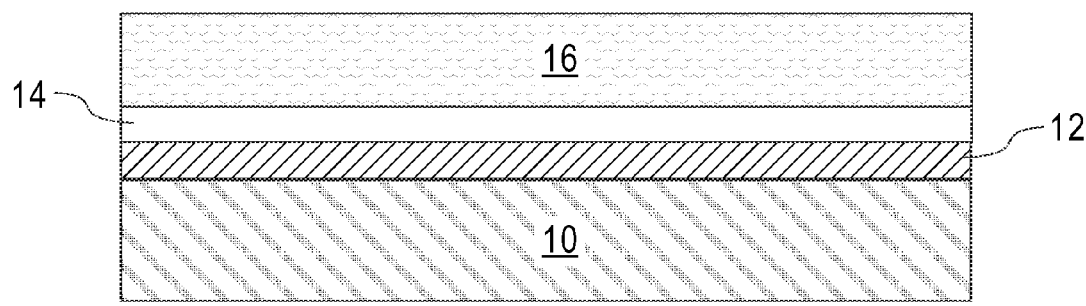
FIG. 2 is a vertical cross sectional view of the initial structure of FIG. 1 after forming a first layered structure by bonding the initial structure to a structure including a carrier substrate and an adhesive layer.

Referring now to FIG. 2, there is illustrated the initial structure of FIG. 1 after forming a first layered structure by bonding the initial structure of FIG. 1 to another structure that includes a carrier substrate 16 and an adhesive layer 14. The first layered structure shown in FIG. 2 includes, from bottom to top, the copper foil 10, the layer of graphene 12, the adhesive layer 14 and the carrier substrate 16.

In accordance with the present disclosure, the another structure used in forming the first layered structure of the present disclosure can be prepared by applying an adhesive material to a surface of a carrier substrate 16. The carrier substrate 16 that can be used in the present disclosure includes any material in which an adhesive material can be applied thereon. In one embodiment of the present disclosure, the carrier substrate 16 can be comprised of glass. In other embodiments, other materials such as, for example, semiconductor materials, metals, and/or insulators can be used as the carrier substrate 16.

The adhesive material that is applied to the carrier substrate 16 and that forms the adhesive layer 14 of the present disclosure includes any adhesive material (inorganic or organic) that can form a bond with the material of the carrier substrate 16 and with the exposed surface of the layer of graphene 12. The adhesive materials that can be employed in the present disclosure must also be capable of forming an adhesive layer that can be readily removed from the surface of the layer of graphene 12 without causing any significant damage to the layer of graphene 12.

The adhesive layer 14 includes any laser ablatable or UV releasable adhesives. Some examples of laser ablatable releasable adhesives include benzocyclobutene, poly (arylene ethers), modified photoresist materials, modified polyimide materials, thermal release tapes, and combinations comprising at least one of the foregoing. In one embodiment of the present disclosure, the adhesive layer 14 includes a HD Microsystems™ material referred to as HD-3007. HD-3007 is a non-photodefinable polyimide precursor which can be employed as a temporary or permanent adhesive. The HD-3007 material exhibits thermoplastic behavior after cure and during bonding at moderate temperature and pressure. HD-3007 is a laser ablatable releasable adhesive.

The adhesive material used in forming the adhesive layer 14 can be applied to an exposed surface of the carrier substrate 16 utilizing a deposition process including, for example, chemical solution deposition, evaporation, and spin-on coating. In one embodiment of the present disclosure, the adhesive material is applied onto the carrier substrate 16 utilizing a spin-on coating process. In short, spin coating includes placing an excess amount of the adhesive material onto the surface of the carrier substrate 16, which is then rotated in a spin coater at high speed in order to spread the adhesive material via centrifugal force. Rotation is continued while the adhesive material spins off the edge of the carrier substrate 16, until a desired thickness is obtained. The adhesive material can be spun onto the carrier substrate 16 at a speed from 750 rpm to 3000 rpm. Other speeds that are lesser than or greater than the aforementioned range can also be employed in the present disclosure. For example, HD-3007 adhesive can be spun onto a glass carrier wafer at 1500 rpm. In embodiments in which a spin-on process is used to apply the adhesive material to the carrier substrate, an edge bead removal process is typically performed to prevent problems with laser separation of the carrier substrate that may occur later in the method of the present disclosure.

In some embodiments of the present disclosure, the adhesive material that is applied to the surface of the carrier substrate 16 is subjected to a curing process which forms the adhesive layer 14 of the present disclosure. The curing process hardens the adhesive material typically by a cross linking mechanism. In one embodiment of the present disclosure, the curing process that can be performed in the present disclosure includes exposing the adhesive material applied to the carrier substrate to heat, i.e., thermal curing. Typically, and when thermal curing is performed, the temperature of the thermal cure can be from 300° C. to 350° C. Thermal curing is typically performed in an inert ambient such as, for example, helium, argon and/or nitrogen. In one embodiment, and when HD 3007 is used as the adhesive material, curing can be performed by thermal curing at 350° C. in nitrogen. It is noted that UV curing is not performed at this stage of the present disclosure, since UV curing may result in unwanted release of the adhesive layer 14 from the carrier substrate 16.

The adhesive layer 14 that is formed on an exposed surface of the carrier substrate 16 can have a thickness from 5000 nm to 6000 nm. Other thicknesses, which are lesser than or greater than the aforementioned thickness range, can also be employed in the present disclosure.

The bonding of the structure including the carrier substrate 16 and the adhesive layer 14 occurs by contacting an exposed surface of the adhesive layer 14 to the exposed surface of the layer of graphene 12 of the initial structure, and applying at least an external pressure on the two structures. Bonding may be achieved using a bonding temperature from nominal room temperature (i.e., 20° C. to 30° C.) up to, and including, 1000° C. The external pressure that is exerted to the contacted structures can be unidirection or bidirectional.

Bonding is typically performed in a bonding tool with a chamber in which a first plate can be applied to an exposed surface of the carrier substrate 16 and a second plate can be applied to an exposed surface of the copper foil 10. The chamber can be closed and evacuated to a pressure from 1E-3 mbar to 1E-2 mbar. The temperature within the chamber can be adjusted to a desired bonding temperature and then a tool pressure can be exerted on the two plates within a range from 8050 mbar to 9000 mbar. The bonding can be performed for a time period from 1 minute to 10 minutes, depending on the conditions used for bonding.

Figure 3:
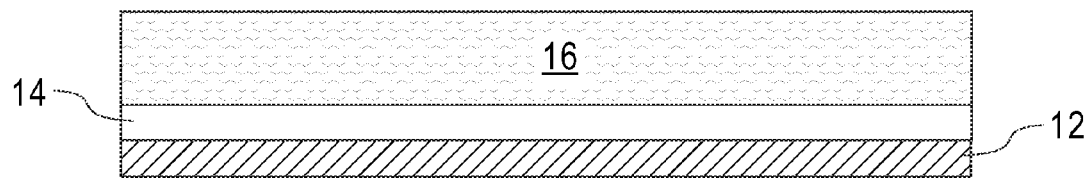
FIG. 3 is a vertical cross sectional view of the first layered structure of FIG. 2 after removing the copper foil and exposing a surface of the layer of graphene.

Referring now to FIG. 3, there is illustrated the first layered structure of FIG. 2 after removing the copper foil 10 from the first layered structure and exposing a surface of the layer of graphene 12. The copper foil 10 can be removed from the first layered structure by utilizing a wet etch process that selectively removes the copper foil 10, stopping on a surface of the layer of graphene 12.

In one embodiment of the present disclosure, the wet etch process that can be used to remove the copper foil 10 from the first layered structure comprises contacting the copper foil 12 with an aqueous solution of ammonium persulfate. In another embodiment of the present disclosure, the wet etch process that can be used to remove the copper foil 10 from the first layered structure comprises contacting the copper foil 12 with an aqueous solution of ferric chloride. In yet another embodiment of the present disclosure, the wet etch process that can be used to remove the copper foil 10 from the first layered structure comprises contacting the copper foil 12 with aqua regia. Aqua regia is a solution that includes a mixture of hydrochloric acid (HCl) and nitric acid ($HNO_3$). The mixture can be formed by freshly mixing concentrated nitric acid and hydrochloric acid usually in a volume ratio of 1:3 or 1:4.

Figure 4:
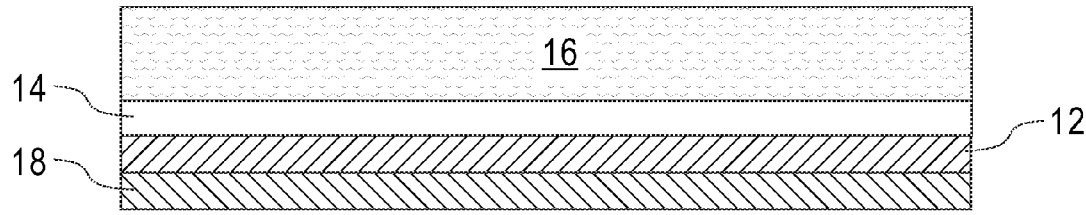
FIG. 4 is a vertical cross sectional view of the structure of SIG. 3 after forming an oxide bonding enhancement dielectric layer on the exposed surface of the layer of graphene.

Referring now to FIG. 4, there is illustrated the structure of FIG. 3 that is formed after forming an oxide bonding enhancement dielectric layer 18 on the exposed surface of the layer of graphene 12. The term "oxide bonding enhancement dielectric layer" is used throughout the present disclosure to denote a dielectric material that has accessible oxygen atoms that can form an oxide to oxide bond with a subsequently formed dielectric oxide layer. The oxide bonding enhancement dielectric layer 18 ensures that a planarization surface is provided for bonding the layer of graphene 12 to a structure including a receiver substrate. The oxide bonding enhancement dielectric layer is derived from a liquid (i.e., solution) dielectric material precursor which forms the oxide bonding enhancement dielectric layer upon application to the layer of graphene.

The oxide bonding enhancement dielectric layer 18 comprises any dielectric material (or multilayered stack thereof) which includes oxides that are capable of forming an oxide to oxide bond with a dielectric oxide material. In one embodiment of the present disclosure, the oxide bonding enhancement dielectric layer 18 comprises hydrogen silsesquioxane (HSQ). HSQ is a cubical-shaped molecule having one Si atom at each corner, with corners being linked via oxygen atoms. Additionally, a hydrogen group is attached to each Si. The formula of HSQ is $H_8Si_8O_{12}$. In another embodiment of the present disclosure, the oxide bonding enhancement dielectric layer 18 comprises methyl-silsesquioxane (MSQ). In addition to HSQ and MSQ, other silsesquioxanes can be used so long as the substituents attached to the corner Si atoms do not prevent the silsesquioxane from forming an oxide-oxide bond with a dielectric oxide material.

The oxide bonding enhancement dielectric layer 18 can be formed utilizing a liquid deposition process including, but not limited to, chemical solution deposition, evaporation, spray coating and spin-on coating. In one embodiment, and when HSQ is employed as the oxide bonding enhancement dielectric layer 18, the HSQ material is spun onto the exposed surface of the layer of graphene 12. In such an embodiment, no post bake is typically performed immediately after applying the HSQ material.

Notwithstanding the technique used to deposit the oxide bonding enhancement dielectric layer 18, the oxide bonding enhancement dielectric layer 18 can have a thickness from 225 Å to 275 Å. Other thicknesses, which are lesser than or greater than the aforementioned thickness range, can also be employed in the present disclosure.

Figure 5:
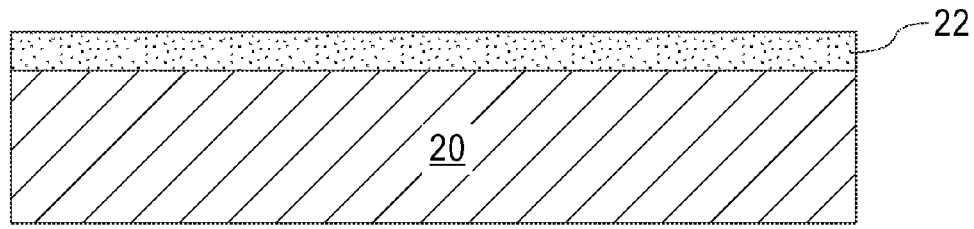
FIG. 5 is a vertical cross sectional view of a second layered structure including a receiver substrate and a dielectric oxide layer that can be used in the present disclosure.

Referring now to FIG. 5, there is illustrated a second layered structure including a receiver substrate 20 and a dielectric oxide layer 22 that can be used in the present disclosure.

In one embodiment of the present disclosure, the receiver substrate 20 includes a semiconductor material such as, but not limited to, Si, Ge, SiGe, SiGeC, SiC, GaAs, InAs, InP and other III/V or II/VI compound semiconductors. The receiver substrate 20 may also include a layered substrate such as, for example, Si/SiGe, Si/Ge, Si/SiC, silicon-on-insulators (SOIs) or silicon germanium-on-insulators (SGOIs). In some embodiments of the present disclosure, the receiver substrate 20 can be an organic semiconductor material. An organic semiconductor is an organic material with semiconductor properties. Single molecules, short chain (oligomers) and organic polymers can be semiconductive. Semiconducting small molecules (aromatic hydrocarbons) include the polycyclic aromatic compounds pentacene, anthracene, and rubrene. Polymeric organic semiconductors include poly(3-hexylthiophene), poly(p-phenylene vinylene), as well as polyacetylene and its derivatives. In one preferred embodiment, the receiver substrate 20 comprises silicon.

The receiver substrate 20 can have a thickness from 725 microns to 775 microns. Other thicknesses, which are lesser than or greater than the aforementioned thickness range, can also be employed in the present disclosure.

The dielectric oxide layer 22 includes any dielectric material that includes oxides which are capable of forming an oxide to oxide bond with the oxide bonding enhancement dielectric layer 18. In one embodiment, the dielectric oxide layer 22 comprises one of the materials mentioned above for the oxide bonding enhancement dielectric layer 18. In such an embodiment, the dielectric oxide layer 22 may comprise a same or different dielectric material as the oxide bonding enhancement dielectric layer 18. In yet another embodiment of the present disclosure, the dielectric oxide layer 22 comprises a semiconductor oxide such as, for example, silicon oxide or germanium oxide. In other embodiments, the oxide bonding enhancement dielectric layer 22 may include thermally grown silicon dioxide.

In one embodiment of the present disclosure, the dielectric oxide layer 22 can be formed onto the surface of the receiver substrate 20 by a deposition process including, for example, chemical vapor deposition, plasma enhanced chemical vapor deposition, chemical solution deposition, evaporation, spin-on coating and atomic layer deposition (ALD). In some embodiments of the present disclosure, the dielectric oxide layer 22 can be formed by a thermal growth process such as, for example, thermal oxidation.

In some embodiments, and prior to forming the dielectric oxide layer 22 on the surface of the receiver substrate 20, the surface of the receiver substrate 20 can be cleaned to remove contaminates from the surface of the receiver substrate 20. In one embodiment, the process used to 'clean' the surface of the receiver substrate 20 includes contacting the surface of the receiver substrate 20 with isopropyl alcohol. Following the contacting with isopropyl alcohol, the 'cleaned' surface of the receiver substrate 20 can be washed with deionized water and then subjected to any well known drying process.

The dielectric oxide layer 22 can have a thickness from 10 nm to 50 nm. Other thicknesses, which are lesser than or greater than the aforementioned thickness range, can also be employed in the present disclosure.

At this point of the present disclosure, at least the oxide bonding enhancement dielectric layer 18 and optionally the dielectric oxide layer 22 can be subjected to curing prior bonding. The curing process hardens at least the oxide bonding enhancement dielectric layer 18 and optionally the dielectric oxide layer 22 typically by a cross linking mechanism. In one embodiment of the present disclosure, the curing process that can be performed in the present disclosure includes exposing at least the oxide bonding enhancement dielectric layer 18 and optionally the dielectric oxide layer 22 to ultraviolet light. In one embodiment, the UV curing can be performed in an inert ambient, i.e., one of helium, argon or nitrogen, at a temperature of from 250° C. to 350° C. In another embodiment, the curing process that can be performed in the present disclosure includes exposing at least the oxide bonding enhancement dielectric layer 18 and optionally the dielectric oxide layer 22 to heat, i.e., thermal curing. Typically, and when thermal curing is performed, the temperature of the thermal cure can be from 325° C. up to, but not beyond the temperature in which the adhesive layer cures. Thermal curing is typically performed in an inert ambient such as, for example helium, argon and/or nitrogen. In one embodiment, and when HSQ is employed as the oxide bonding enhancement dielectric layer 18, curing can be performed by thermal curing at 550° C. in helium. During the curing process, a vacuum can be applied to remove hydrogen atoms that are released from the at least the oxide bonding enhancement dielectric layer 18 and optionally the dielectric oxide layer 22 during the curing process.

Figure 6:
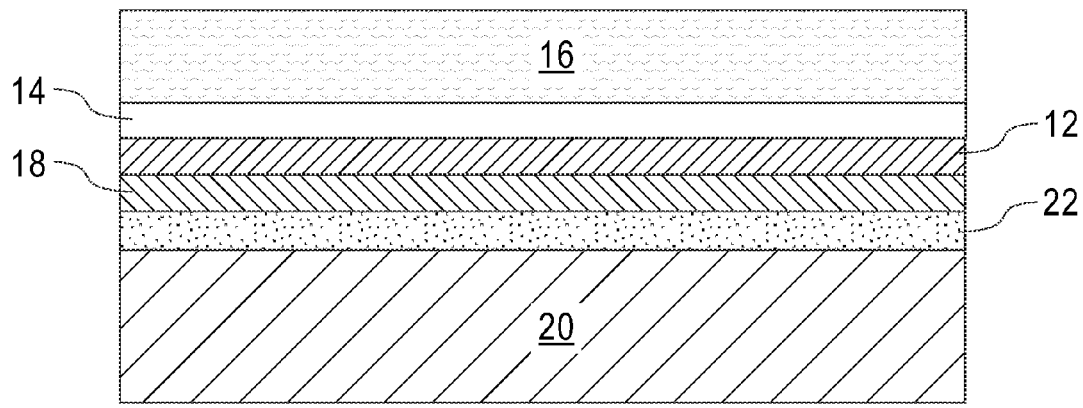
FIG. 6 is a vertical cross sectional view after bonding the first layered structure shown in FIG. 4 to the second layered structure shown in FIG. 5.

Referring now to FIG. 6, there is illustrated the resultant structure that is formed after bonding the first layered structure shown in FIG. 4 to the second layered structure shown in FIG. 5. The bonded structure that is formed includes, from bottom to top, receiver substrate 20, dielectric oxide layer 22, oxide bonding enhancement dielectric layer 18, layer of graphene 12, adhesive layer 14, and carrier substrate 16. When the dielectric oxide layer 22 and the oxide bonding enhancement dielectric layer 18 comprise a different dielectric material, an interface is present between the two layers. In other embodiments, and when the dielectric oxide layer 22 and the oxide bonding enhancement dielectric layer 18 comprise the same dielectric material, i.e., HSQ, no interface is present between the two layers; in this instance, the bonded structure could be considered to not include a separate dielectric oxide layer 22. In accordance with the present disclosure, the bonding process results in the formation of oxide-oxide bonds between the oxide bonding enhancement dielectric layer 18 and the dielectric oxide layer 22.

The bonding of the first layered structure shown in FIG. 4 to the second layered structure shown in FIG. 5 comprises bringing the two layered structures into intimate contact with each such that the dielectric oxide layer 22 of the second layered structure contacts the oxide bonding enhancement dielectric layer 18 of the first layered structure. Next, an external pressure can be applied on the now contacting two layered structures. Bonding may be achieved using a bonding temperature from nominal room temperature (i.e., 20° C. to 30° C.) to up to, and including, 1000° C. The external pressure that is exerted to the contacted structures can be unidirection or bidirectional.

In this step of the present disclosure, bonding is typically performed in a bonding tool with a chamber in which a first plate can be applied to an exposed surface of the carrier substrate 16 and a second plate can be applied to an exposed surface of the receiver substrate 20. The chamber can be closed and evacuated to a pressure from 1E-3 mbar to 1E-2 mbar. The temperature within the chamber can be adjusted to a desired bonding temperature and then a tool pressure can be exerted on the two plates within a range from 8050 mbar to 9000 mbar. The bonding can be performed for a time period from 1 minute to 10 minutes, depending on the conditions used for bonding.

Figure 7:
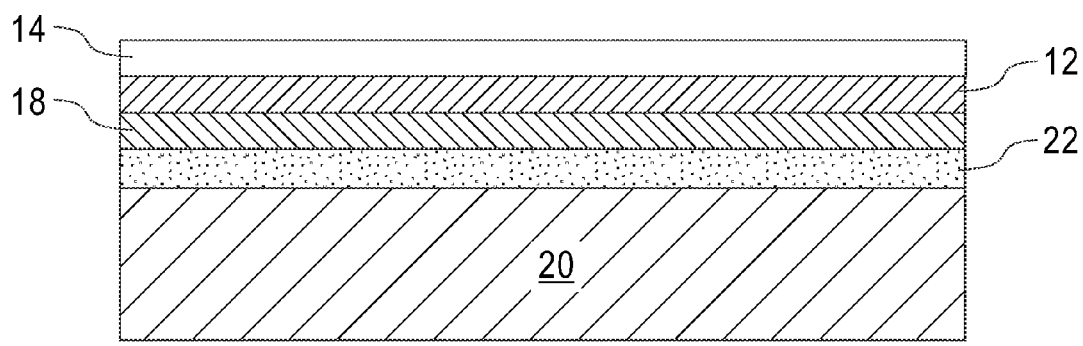
FIG. 7 is a vertical cross sectional view of the structure shown in FIG. 6 after removing the carrier substrate.

Referring now to FIG. 7, there is illustrated the structure of FIG. 6 after removing the carrier substrate 16 from the bonded structure including the first and second layered structures. In one embodiment of the present disclosure, the carrier substrate 16 can be removed by laser ablation. In another embodiment, the carrier substrate 16 can be removed via a planarization process such as, for example, chemical mechanical polishing and/or grinding. In yet another embodiment of the present disclosure, the carrier substrate 16 can be removed by a chemical wet etching process.

Figure 8:
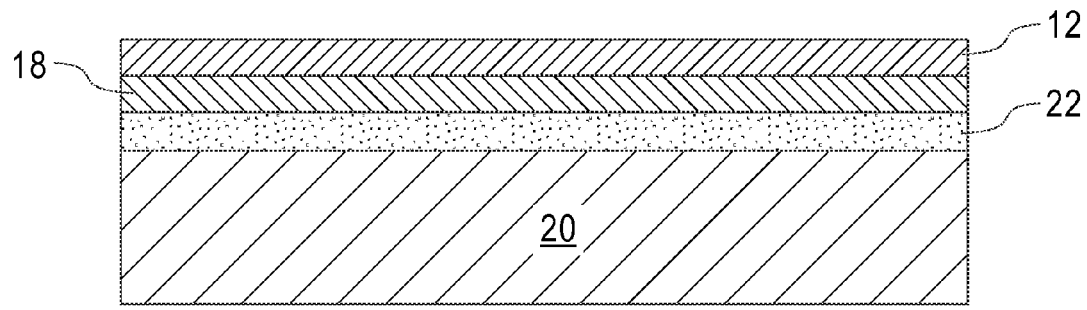
FIG. 8 is a vertical cross sectional view of the structure shown in FIG. 7 after removing the adhesive layer.

Referring now to FIG. 8, there is illustrated the structure shown in FIG. 7 after removing the adhesive layer 14 from atop the layer of graphene 12. In one embodiment of the present disclosure, the adhesive layer 14 can be removed utilizing a chemical stripping process. One example of a chemical stripping process that can be used in the present disclosure includes a TMAH (trimethyl ammonium hydroxide) based stripping agent. After removing the adhesive layer 14 from the bonded structure, a surface of the graphene layer 12 is exposed.

Referring back to FIG. 8, there is shown the resultant structure of the present disclosure. The structure includes, from bottom to top, receiver substrate 20, optional dielectric oxide layer 22, oxide bonding enhancement dielectric layer 18, and the layer of graphene 12 which has an exposed surface. It is again noted that when the dielectric oxide layer 22 and the oxide bonding enhancement dielectric layer 18 comprise the same protective polymeric material those two layers could be considered as a single layer in the structure of the present disclosure since no interface would exist between the two layers.

Figure 9:
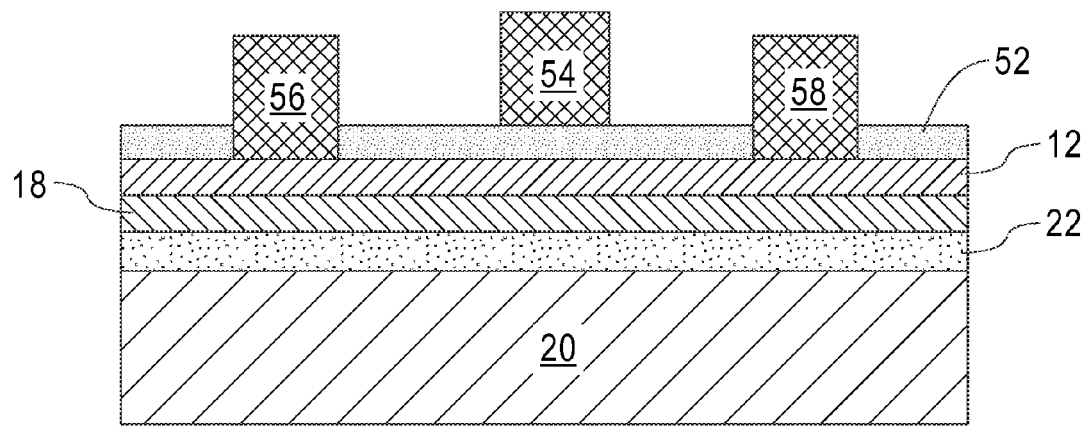
FIG. 9 is a vertical cross sectional view of an exemplary semiconductor device that includes the structure shown in FIG. 8 in accordance with an embodiment of the present disclosure.

Reference is now made to FIG. 9 which is a cross sectional view of a semiconductor device of the present disclosure that includes the structure shown FIG. 8 As shown, the semiconductor device includes the structure of FIG. 8, a gate dielectric layer 52 located on an upper surface of the layer of graphene 12, a gate conductor 54 located on a portion of the gate dielectric layer 52, and a source region 56 and a drain region 58 located on an upper surface of the layer of graphene 12 and on opposite sides of the gate conductor 54. The source region 56 and the drain region 58 extend through the gate dielectric layer 52 contacting an upper surface of the layer of graphene 12.

The semiconductor device shown in FIG. 9 can be formed by first providing the structure shown in FIG. 8. Next, gate dielectric layer 52 is formed on an upper surface of the layer of graphene 12. The gate dielectric layer 52 employed can include any insulating material such as for example, an organic polymer, an oxide, a nitride, an oxynitride or a multilayered stack thereof. In one embodiment, the gate dielectric layer 52 can include a semiconductor oxide, a semiconductor nitride or a semiconductor oxynitride. In another embodiment, the gate dielectric layer 52 can include a dielectric metal oxide or mixed metal oxide having a dielectric constant that is greater than the dielectric constant of silicon oxide, i.e., 3.9. Typically, the dielectric material that can be employed as the gate dielectric layer 52 has a dielectric constant greater than 4.0, with a dielectric constant of greater than 8.0 being more typical. Such dielectric materials are referred to herein as high k dielectrics. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Multilayered stacks of these high k materials can also be employed as the gate dielectric layer 52. Each value of x is independently from 0.5 to 3 and each value of y is independently from 0 to 2.

The thickness of the gate dielectric layer 52 that can be employed may vary depending on the technique used to form the same. Typically, the gate dielectric layer 52 that can be employed has a thickness from 1 nm to 20 nm, with a thickness from 2 nm to 10 nm being more typical.

The gate dielectric layer 52 can be formed by methods well known in the art. In one embodiment, the gate dielectric layer 52 can be formed by a deposition process such as, for example, chemical vapor deposition (CVD), plasma enhanced chemical vapor deposition (PECVD), physical vapor deposition (PVD), molecular beam deposition (MBD), pulsed laser deposition (PLD), liquid source misted chemical deposition (LSMCD), and atomic layer deposition (ALD). If the gate dielectric is a stack of several layers, some of the layers can be deposited by chemical solution deposition or spin-on technique.

After forming the gate dielectric layer 52, the gate conductor 54 can be formed. The gate conductor 54 includes any conductive material including, but not limited to, polycrystalline silicon, polycrystalline silicon germanium, an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. In one embodiment, the conductive material that can be employed as gate conductor 54 can be comprised of an nFET metal gate. In another embodiment, the conductive material that can be employed as gate conductor 54 can be comprised of a pFET metal gate. In a further embodiment, the conductive material that can be employed as gate conductor 54 can be comprised of polycrystalline silicon. The polysilicon conductive material can be used alone, or in conjunction with another conductive material such as, for example, a metal conductive material and/or a metal silicide material.

The conductive material that is employed as gate conductor 54 can be formed utilizing a conventional deposition process including, for example, chemical vapor deposition (CVD), plasma enhanced chemical vapor deposition (PECVD), physical vapor deposition (PVD), sputtering, atomic layer deposition (ALD) and other like deposition processes. When Si-containing materials are used as the conductive material, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed. The as-deposited conductive material typically has a thickness from 1 nm to 100 nm, with a thickness from 3 nm to 30 nm being even more typical.

Following deposition of the conductive material, the conductive material is patterned by lithography into the gate conductor 54.

The semiconductor device of FIG. 9 further includes source region 56 and drain region 58 that make electrical contact to portions of upper surface of the layer of graphene 12. The source region 56 and the drain region 58 include one of the conductive materials mentioned above for gate conductor 54. The source region 56 and the drain region 58 can be formed by etching an opening in the gate dielectric layer 52, deposition, lithography and etching.

Figure 10:
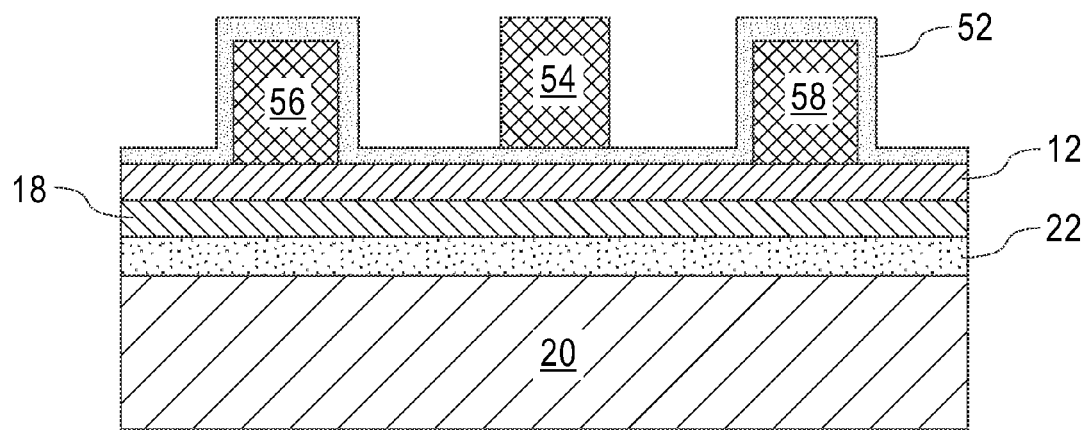
FIG. 10 is a vertical cross sectional view of another exemplary semiconductor device that includes the structure shown in FIG. 8 in accordance with another embodiment of the present disclosure.

Reference is now made to FIG. 10 which is a cross sectional view of another semiconductor device that includes the structure shown in FIG. 8. The another semiconductor device includes the structure of FIG. 8, a gate dielectric layer 52, a gate conductor 54 located on a portion of the gate dielectric layer 52, and a source region 56 and a drain region 58 located on an upper surface of the layer of graphene 12 and on opposite sides of the gate conductor 54. In this embodiment, a portion of the gate dielectric 52 is located on sidewalls and atop the source region 56 and the drain region 58. The elements of another semiconductor device illustrated in FIG. 10 which have like reference numerals as the elements of the semiconductor device shown in FIG. 9, include the materials mentioned above. The another semiconductor device shown in FIG. 10 can be formed similar to the semiconductor device shown in FIG. 9 mentioned above except that the source region 56 and drain region 58 are formed prior to forming the gate dielectric layer 52 and the gate conductor 54. In this embodiment, a conventional lift off process can be employed in forming the source region 56 and the drain region 58. Alternatively, the source region 56 and the drain region 58 can be formed by deposition, lithography and etching.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising, from bottom to top,
a receiver substrate;
a dielectric oxide layer located directly on an entirety of an uppermost surface of said receiver substrate;
an oxide bonding enhancement dielectric layer located directly on an entirety of an uppermost surface of said dielectric oxide layer, wherein said oxide bonding enhancement dielectric layer comprises a silsesquioxane; and
a layer of graphene located directly on an entirety of an uppermost surface of said oxide bonding enhancement dielectric layer, wherein said oxide bonding enhancement dielectric layer has outermost sidewall edges that are vertically coincident to outer sidewall edges of said oxide dielectric layer.

2. The semiconductor structure of claim 1, wherein said oxide bonding enhancement dielectric layer comprises hydrogen silsesquioxane, or methyl silsesquioxane.

3. The semiconductor structure of claim 1, wherein said receiver substrate comprises a semiconductor material.

4. The semiconductor structure of claim 1, wherein said layer of graphene comprises a monolayer.

5. A semiconductor structure comprising:
a receiver substrate;
a dielectric oxide layer located directly on an entirety of an uppermost surface of said receiver substrate;
an oxide bonding enhancement dielectric layer located directly on an entirety of an uppermost surface of said dielectric oxide layer, wherein said oxide bonding enhancement dielectric layer comprises a silsesquioxane; and
graphene-containing device located atop the oxide bonding enhancement dielectric layer, wherein said graphene-containing device includes at least a layer of graphene that serves as a channel of a field effect transistor and has a bottommost surface in direct contact with an entirety of an uppermost surface of the oxide bonding enhancement dielectric layer, and wherein said oxide bonding enhancement dielectric layer has outermost sidewall edges that are vertically coincident to outer sidewall edges of said oxide dielectric layer and an oxide to oxide bonding interface is present between said dielectric oxide layer and said oxide bonding enhancement dielectric layer.

6. The semiconductor structure of claim 5, wherein said dielectric oxide layer is comprised of a different dielectric material than the oxide bonding enhancement dielectric layer.

7. The semiconductor structure of claim 5, wherein said oxide bonding enhancement dielectric layer comprises hydrogen silsesquioxane, or methyl silsesquioxane.

8. The semiconductor structure of claim 5, wherein said receiver substrate comprises a semiconductor material.

9. The semiconductor structure of claim 5, wherein said silsesquioxane is a cross-linked dielectric material.

10. The semiconductor structure of claim 5, wherein said silsesquioxane is a cross-linked dielectric material.

11. A semiconductor structure comprising:
a receiver substrate;
a dielectric oxide layer located directly on an entirety of an uppermost surface of said receiver substrate;
an oxide bonding enhancement dielectric layer located directly on an entirety of an uppermost surface of said dielectric oxide, wherein said oxide bonding enhancement dielectric layer comprises a silsesquioxane; and a graphene-containing device located atop the oxide bonding enhancement dielectric layer, wherein said graphene-containing device includes at least a layer of graphene having a bottommost surface in direct contact with an uppermost surface of the oxide bonding enhancement dielectric layer, and wherein said oxide bonding enhancement dielectric layer has outermost sidewall edges that are vertically coincident to outer sidewall edges of said oxide dielectric layer.

12. The semiconductor structure of claim 11, wherein said layer of graphene serves as a channel of a field effect transistor.

13. The semiconductor of claim 12, wherein said field effect transistor comprises a gate dielectric layer in direct contact with an exposed surface of the layer of graphene, a gate conductor overlying a portion of the gate dielectric layer, a source contact and a drain contact, said source and drain contacts each having a bottommost surface in direct contact with an uppermost surface of the layer of graphene.

14. The semiconductor structure of claim 13, wherein said gate dielectric layer is present on exposed sidewalls and atop each of the source contact and the drain contact.

15. The semiconductor structure of claim 13, wherein said source contact and said drain contact each comprise a conductive material.

* * * * *